United States Patent
Su

(10) Patent No.: US 9,281,661 B2
(45) Date of Patent: Mar. 8, 2016

(54) INTEGRATED OPTOELECTRONIC DEVICE COMPRISING A MACH-ZEHNDER MODULATOR AND A VERTICAL CAVITY SURFACE EMITTING LASER (VCSEL)

(71) Applicant: Avago Technologies General IP (Singapore) Pte. Ltd., Singapore (SG)

(72) Inventor: Chung-Yi Su, Fremont, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/322,880

(22) Filed: Jul. 2, 2014

(65) Prior Publication Data

US 2016/0006213 A1    Jan. 7, 2016

(51) Int. Cl.
*H01S 5/183* (2006.01)
*H01S 5/187* (2006.01)
*H01S 5/34* (2006.01)
*G02F 1/225* (2006.01)
*G02F 1/21* (2006.01)

(52) U.S. Cl.
CPC .......... *H01S 5/18302* (2013.01); *G02F 1/2257* (2013.01); *H01S 5/187* (2013.01); *H01S 5/18327* (2013.01); *H01S 5/34* (2013.01); *G02F 2001/212* (2013.01)

(58) Field of Classification Search
CPC ... G02F 1/2257; H01S 5/0085; H01S 5/0268; H01S 5/18302
See application file for complete search history.

(56) References Cited

U.S. PATENT DOCUMENTS

| 5,659,568 | A  * | 8/1997 | Wang et al. ............... 372/96 |
| 7,999,988 | B2 |  8/2011 | Koch |
| 2005/0040410 | A1* | 2/2005 | Ledentsov et al. ........... 257/79 |
| 2007/0195847 | A1* | 8/2007 | Fukamachi et al. ....... 372/46.01 |
| 2011/0076026 | A1* | 3/2011 | Ledentsov et al. .......... 398/140 |

FOREIGN PATENT DOCUMENTS

WO    2011043718 A1    4/2011

OTHER PUBLICATIONS

G-H. Duan, C. Jany, A Le Liepvr, J-G. Provost, D. Make, F. Lelarge, M. Lamponi, F. Poingt, J.-M. Fedeli, S. Messaoudene, D. Bordel, S. Brision, S. Keyvaninia, G. Roelkens, D. Van Thourhout, D. J. Thomson, F.Y. Gardes and G.T. Reed, 10 Gb/s Integrated Tunable Hybrid III-V/Si Laser and Silicon Mach-Zehnder Modulator, ECOC Technical Digest, 2012, Tu.4.E.2, OSA.

(Continued)

*Primary Examiner* — Yuanda Zhang
*Assistant Examiner* — Michael Carter

(57) ABSTRACT

A Mach-Zehnder modulator (MZM) is horizontally integrated with a VCSEL. The horizontally-integrated MZM overcomes wavelength dependence problems of horizontally-integrated EA modulators and yet has the same advantages as horizontally-integrated EA modulators in terms of overcoming the ER and modulation range problems associated with the vertically-integrated EA and EO modulators. By overcoming these problems with the existing integrated modulators, the operation speed of the VCSEL is increased and the modulation signal range is extended to allow a wider range of modulation signals and modulation schemes, including large-signal digital modulation schemes.

28 Claims, 5 Drawing Sheets

(56) References Cited

OTHER PUBLICATIONS

Arvind Arora, Mitsubishi Electric Develops Monolithically Integrated Laser Diode, TMCnet infoTech Spotlight, Japan, Mar. 2011, http://it.tmcnet.com/topics/it/articles/150363-mitsubishi-electric-develops-monolithically-integrated-laser-diode.htm.

Hamed Dalir, Yuta Takahashi and Fumio Koyama, Low Driving Voltage (< 400mVpp) Electro-absorption Modulator Laterally Integrated with VCSEL, Photonics Integration System Research Center, Precision and Intelligence Lab, Tokyo Institute of Technology, http://www.photonics.intec.ugent.be/download/pub_2969.pdf.

* cited by examiner

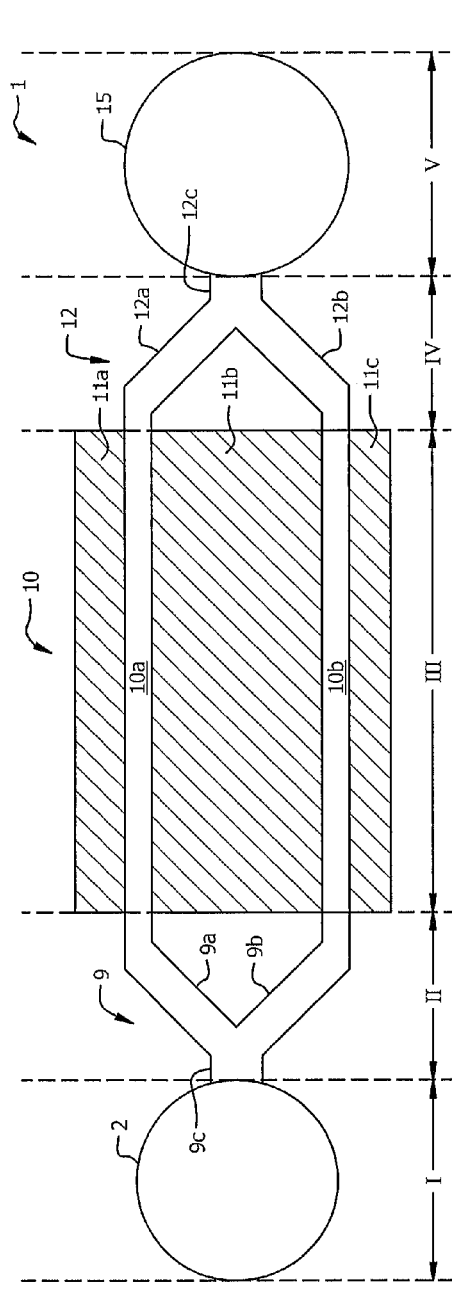
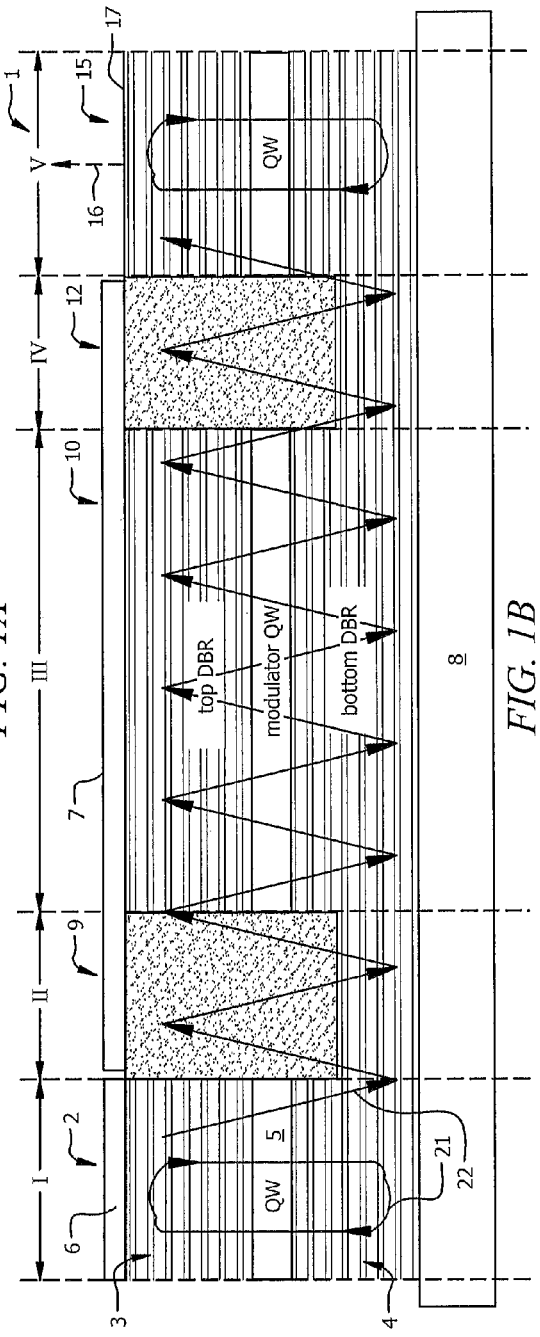
FIG. 1A
FIG. 1B

INTEGRATED OPTOELECTRONIC DEVICE COMPRISING A MACH-ZEHNDER MODULATOR AND A VERTICAL CAVITY SURFACE EMITTING LASER (VCSEL)

TECHNICAL FIELD OF THE INVENTION

The invention relates to vertical cavity surface emitting lasers (VCSELs). More particularly, the invention relates to a VCSEL and a Mach-Zehnder modulator integrated together in an integrated circuit (IC).

BACKGROUND OF THE INVENTION

VCSEL devices are laser diode devices used in a variety of applications to generate optical signals. For example, in optical communications networks, VCSEL devices are often used to generate optical information signals that are transmitted over optical fibers of the network. The most common configuration of a VCSEL is one that includes a conducting n-type substrate, an n-type distributed Bragg reflector (DBR) disposed on the top surface of the substrate (the bottom DBR), an active region typically comprising multiple quantum well (QW) layers disposed on top of n-type DBR, a p-type DBR disposed on top of the QW layers (the top DBR), an ohmic n-contact, and an ohmic p-contact. The ohmic n- and p-contacts correspond to the terminals of the VCSEL.

When an electric potential is applied across the terminals, electrons from the n-type layers that are adjacent to the QW layers and holes from the p-type layers that are adjacent the QW layers are injected into the active region where they combine to produce photons. This combining of holes and electrons in the active region to produce photons is a phenomenon known as spontaneous emission. As the photons pass out of the active region, they are repeatedly reflected by the top and bottom DBRs back into the active region, which results in more recombination of electrons and holes in the active region. This is a phenomenon known as stimulated emission. The repeated reflection of photons by the DBRs back into the active region provides the "pumping" action that leads to lasing.

The speed at which a VCSEL can be driven, or modulated, ultimately is limited by the onset of relaxation oscillation inherent to the operation of the VCSEL. The relaxation oscillation is a manifestation of the energy exchanged between the total photon and carrier populations when the laser is disturbed from a steady state condition. This energy exchange results in a damped optical output power oscillation at the relaxation oscillation frequency. The relaxation oscillation frequency is a function of the square root of the laser bias current. In general, the relaxation oscillation frequency, $f_R$, for a given bias current is relatable to the maximum modulation frequency bandwidth at which a laser diode can be driven, defined by the figure of merit $f_{3dB}$, by the expression:

$$f_{3dB} \sim 1.55 * f_R.$$

Thus, the 3-decibel (dB) modulation bandwidth of the laser diode is limited to a value of about 1.55 times the relaxation oscillation frequency.

In directly-modulated VCSELs, $f_R$ is limited to less than 30 Gigahertz (GHz) due to limitations on photon density resulting in large part from device reliability requirements and material differential gain saturation. In addition, because $f_R$ changes with the VCSEL bias current, it is difficult to use equalization schemes to extend the data rate for large-signal digital modulation schemes such as the non-return-to-zero (NRZ) and pulse amplitude modulation (PAM) 4 modulation schemes.

Indirectly-modulated VCSELs do not have the above limitations on $f_R$, but they raise other problems. For example, vertically-integrated electro-absorption (EA) modulators are too thin to produce a useful extinction ratio (ER). Vertically-integrated electro-optical (EO) modulators tend to interfere with the operation of the underlying VCSEL, and therefore have very limited ranges of modulation.

A horizontally-integrated EA modulator solves the problems associated with the vertically-integrated EA and EO modulators, but it does not remove the inherent limitations of an EA modulator in terms of wavelength dependence of ER and the tradeoff between this characteristic and insertion loss, which makes EA modulators less suitable for use with large-signal modulation schemes involving multi-level signal coding.

It would be desirable to provide a VCSEL having a horizontally-integrated modulator that overcomes the aforementioned problem of the horizontally-integrated EA modulator and that has the advantages of the horizontally-integrated EA modulator in terms of overcoming the ER and modulation range problems associated with the vertically-integrated EA and EO modulators.

SUMMARY OF THE INVENTION

The invention provides an integrated optoelectronic device comprising a VCSEL and a Mach-Zehnder modulator integrated together in an IC. In accordance with an embodiment, the optoelectronic device comprises a substrate, a first VCSEL, and a Mach-Zehnder modulator (MZM). The first VCSEL is disposed on the substrate. The first VCSEL has a first DBR disposed above the substrate, a first QW region disposed above the first DBR, a second DBR disposed above the first QW region, and a first reflector disposed above the second DBR opposite the substrate. The first reflector reflects light produced by the first VCSEL back into the optoelectronic device. The MZM is horizontally integrated into the optoelectronic device beside the first VCSEL. The MZM receives light produced by the first VCSEL and modulates the received light to produce a modulated optical signal. The MZM has a second reflector disposed in or on it that prevents the light received from the first VCSEL from passing through a top surface of the MZM.

In accordance with another embodiment, the optoelectronic device comprises a substrate, a first VCSEL, an MZM, and an output cavity. The first VCSEL is disposed on the substrate. The first VCSEL has a first DBR disposed above the substrate, a first QW region disposed above the first DBR, a second DBR disposed above the first QW region, and a first reflector disposed above the second DBR and the MZM opposite the substrate. The first reflector reflects light produced by the first VCSEL back into the optoelectronic device. The MZM is horizontally integrated into the optoelectronic device beside the first VCSEL. The MZM receives light produced by the first VCSEL and modulates the received light to produce a modulated optical signal. The MZM has a second reflector disposed in or on it that prevents the light received from the first VCSEL from passing through the top surface of the MZM. The output cavity is horizontally integrated into the optoelectronic device beside the MZM opposite the first VCSEL. The output cavity receives the modulated optical signal passing out of the MZM and directs the modulated optical signal out of the optoelectronic device in a direction parallel to an optical axis of the output cavity.

In accordance with another embodiment, the optoelectronic device comprises a substrate, a first VCSEL, an MZM, and an output cavity. The first VCSEL is disposed on the substrate. The first VCSEL has a first DBR disposed above the substrate, a first QW region disposed above the first DBR, a second DBR disposed above the first QW region, and a first reflector disposed above the second DBR opposite the substrate. The first reflector reflects light produced by the first VCSEL at a small non-zero-degree angle relative to a normal to the lower surface of the first reflector. The MZM is horizontally integrated into the optoelectronic device beside the first VCSEL. The MZM receives the light reflected at the small non-zero-degree angle. The light propagates through the MZM being reflected by upper and lower DBRs of the MZM at the small angle. The MZM modulates the received light to produce a modulated optical signal. The MZM has a second reflector disposed in or on the MZM that prevents the light received from the first VCSEL from passing through the top surface of the MZM. The output cavity is horizontally integrated into the optoelectronic device beside the MZM opposite the first VCSEL. The output cavity receives the modulated optical signal passing out of the MZM and directs the modulated optical signal out of the optoelectronic device in a direction parallel to an optical axis of the output cavity.

These and other features and advantages of the invention will become apparent from the following description, drawings and claims.

BRIEF DESCRIPTION OF THE DRAWINGS

FIG. 1A illustrates a top view of an integrated optoelectronic device comprising a VCSEL and a horizontally-integrated MZM in accordance with an illustrative embodiment.

FIG. 1B illustrates a side view of the integrated optoelectronic device 1 shown in FIG. 1A.

DETAILED DESCRIPTION OF AN EMBODIMENT

Figure 2:
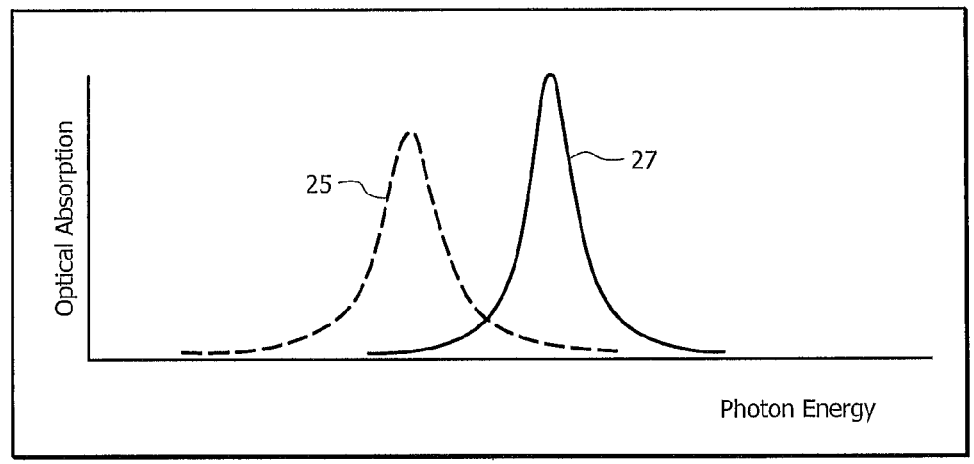
FIG. 2 is a graphical illustration with first and second curves showing a change in optical absorption as a function of photon energy in the MZM shown in FIGS. 1A and 1B in the absence of an electric field and in the presence of an electric field, respectively.

In accordance with illustrative embodiments, an optoelectronic device comprises a Mach-Zehnder modulator (MZM) horizontally integrated with a VCSEL. The horizontally-integrated MZM relies on a difference between phase shifts produced by the two arms of the MZM caused by applying a modulated electric field to the arms to modulate the continuous wave (CW) light output from the integrated VCSEL. By relying on this phase difference to modulate the continuous wave (CW) light output from the integrated VCSEL, the horizontally-integrated MZM overcomes the aforementioned wavelength dependence problem of the horizontally-integrated EA modulator and yet has the same advantages as the horizontally-integrated EA modulator in terms of overcoming the ER and modulation range problems associated with the vertically-integrated EA and EO modulators. By overcoming all of these problems with the existing integrated modulators, the operation speed of the VCSEL is increased and the modulation signal range of the VCSEL is extended to allow a wider range of modulation signals and modulation schemes, including large-signal digital modulation schemes.

An illustrative embodiment of the VCSEL with the horizontally-integrated MZM will now be described with reference to FIGS. 1-6, in which like reference numerals represent like elements, features and components. It should be noted that features, elements and components in the drawings are not intended to be drawn to scale.

FIG. 1A illustrates a top view of an integrated optoelectronic device 1 comprising a VCSEL and a horizontally-integrated MZM in accordance with an illustrative embodiment. FIG. 1B illustrates a side view of the integrated optoelectronic device 1 shown in FIG. 1A. Before describing the principle of operation of the integrated optoelectronic device 1, the structure of the device 1 in accordance with an illustrative embodiment will be described with reference to FIGS. 1A and 1B.

Vertical dashed lines drawn across the device 1 in FIGS. 1A and 1B subdivide the device 1 horizontally into different regions. Region I comprises a single-mode or multi-mode VCSEL 2 of a type that is well known in the industry. The VCSEL 2 has a top DBR 3 made up of a plurality of layers of material of alternating high and low refractive indexes. The VCSEL 2 has a bottom DBR 4 made up of a plurality of layers of material of alternating high and low refractive indexes. The VCSEL 2 has a quantum well (QW) region 5 sandwiched in between the top and bottom DBRs 3 and 4. The top surface of the VCSEL 2 is covered with a layer 6 of highly-reflective material, such as metal, which prevents light from being emitted from the top side of the VCSEL 2. VCSEL 2 has a current confinement structure and an optical confinement structure that limit the light emission laterally within the region I defined by the dashed lines. For clarity, the current confinement and optical confinement structures are not shown. The optical confinement structure of the VCSEL 2 is interrupted at the intersection between regions I and II to allow a portion of the lasing light in VCSEL 2 to leak into region II.

Because the lasing mode in VCSEL 2 traverses substantially in the vertical direction, the light leaked into region II propagates at a very small angle relative to a normal to the plane of layer 6. The angle of reflection ranges from 0° to about 20° and is typically less than or equal to about 12°. The advantages of this small angle of reflection will be described below in detail with reference to the principle of operation of the device 1. Many different combinations of materials may be used for the top and bottom DBRs 3 and 4, including p- or n-doped semiconductor or dielectric materials. Likewise, many possible combinations of materials may be used for the layers that make up the QW region 5. Many possible arrangements of electrodes (not shown for purposes of clarity) can be used for biasing the VCSEL 2. There are also many ways to realize the electrical and optical confinement regions of the VCSEL 2.

The layers that make up the DBRs 3 and 4 and the QW region 5 are typically grown using known epitaxial processes.

The combination of these layers will be referred to herein as the epitaxial structure, or epi-structure. The epi-structure is grown on the top surface of a substrate 8, which may be made of an n-type material, a p-type material, or a semi-insulating material. The VCSEL 2 has at least one aperture, but may have multiple apertures in order to increase the optical power of the light that is ultimately directed from the VCSEL 2 into region II. Region II comprises a VCSEL-to-MZM coupling 9. The VCSEL-to-MZM coupling 9 is an input Y-junction of a standard Mach-Zehnder interferometer with lateral optical confinement branches 9a and 9b (i.e., refractive index guiding branches), which may be formed by the same fabrication step by which the lateral optical confinement regions of VCSEL 2 are formed. The region II is typically subjected to an ion implantation step to electrically isolate region II from region I. While a single optical coupling 9c is shown coupling the VCSEL 2 to the branches 9a and 9b of the Y-junction, if the VCSEL 2 has multiple apertures, then the same number of optical couplings as there are apertures will join the VCSEL 2 to the branches 9a and 9b of the Y-junction. The VCSEL-to-MZM coupling 9 and the VCSEL 2 may share the same epi-structure.

Region III comprises the MZM 10. The hashed boxes 11a-11c in this region represent the electrodes that are used to apply electric potentials across the MZM 10, as will be described below with reference to the principle of operation of the device 1. The electrodes 11a-11c may be arranged in a variety of different arrangements, e.g., symmetrical, asymmetrical, single-ended, push-pull, etc., as will be understood by persons of skill in the art. The MZM 10 includes Mach-Zehnder optical confinement arms 10a and 10b, which are optical waveguides. The arms 10a and 10b have first ends that join the optical confinement branches 9a and 9b, respectively, at the interface of regions II and III. The MZM 10 and the VCSEL 2 may share the same epi-structure, which may also be shared by the VCSEL-to-MZM coupling 9. Alternatively, the MZM 10 may comprise a separate, selectively grown epi-structure. Most or all of the top surface of the MZM 10, including the surface above the VCSEL-to-MZM coupling 9, the arms 10a and 10b, the electrodes 11a-11c, and an MZM-to-output cavity coupling 12 is covered with a layer of highly reflective material 7 to prevent the laser light from propagating through the top surface of the device 1 in these regions.

Layer 7, if implemented as a metal layer, may or may not be connected to electrodes 11a and 11b or to electrodes 11b and 11c. If layer 7 is not connected to one or more of the electrodes 11a-11c, layer 7 may extend over the top of VCSEL 2, thereby eliminating the need for reflective layer 6. Therefore, while layers 6 and 7 are shown as being separate layers, they may, in some cases, be different portions of the same layer or layers.

Region IV is an MZM-to-output cavity coupling 12 that may be identical to the VCSEL-to-MZM coupling 9. The MZM-to-output cavity coupling 12 is an output Y-junction of a standard Mach-Zehnder interferometer with lateral optical confinement branches 12a and 12b (i.e., refractive index guiding branches), which may be formed by the same fabrication step by which the lateral optical confinement regions of the VCSEL 2 and the branches 9a and 9b of the VCSEL-to-MZM coupling 9 are formed. First ends of the branches 12a and 12b are joined to second ends of the arms 10a and 10b, respectively, and second ends of the branches 12a and 12b are joined to an output optical coupling 12c at the interface between region IV and region V.

Region V contains an output cavity 15 that may have an epi-structure identical to that of VCSEL 2, except that the output cavity 15 may have lateral optical confinement regions that are different in size and/or shape from the lateral optical confinement regions of VCSEL 2 in order to encourage light to propagate in a single direction as it enters the output cavity 15. The output cavity 15 may be unbiased, in which case it passes light passively into vertical emission in the direction of arrow 16. Alternatively, the output cavity 15 may be positively biased to cause it to amplify the light received from the MZM 10. If the output cavity 15 is biased, it will have electrodes (not shown for clarity) for applying an electric potential to the output cavity 15. As with the electrodes of the VCSEL 2, the electrodes of output cavity 15 may be arranged in a variety of arrangements. The top surface 17 of the output cavity 15 is left uncovered to allow vertical emission of the light.

Figure 3:
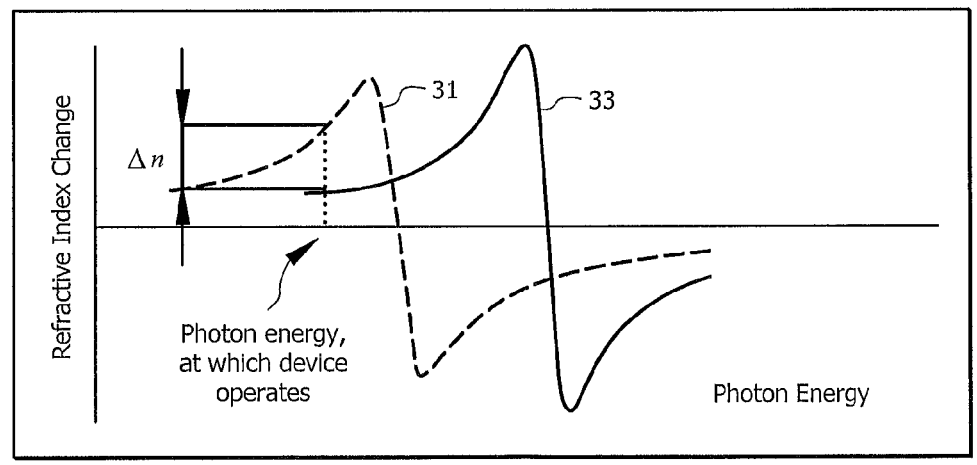
FIG. 3 is a graphical illustration with first and second curves showing a change in refractive index as a function of photon energy in the MZM shown in FIGS. 1A and 1B in the absence of an electric field and in the presence of an electric field, respectively.

FIG. 2 is a graphical illustration with first and second curves 25 and 27 showing a change in optical absorption as a function of photon energy in the MZM 10 in the absence of an electric field and in the presence of an electric field, respectively. This change in optical absorption as a function of photon energy is a phenomenon known as the Quantum Confined Stark Effect (QCSE). FIG. 3 is a graphical illustration with first and second curves 31 and 33 showing a change in refractive index as a function of photon energy in the MZM 10 in the absence of an electric field and in the presence of an electric field, respectively. This change in refractive index that occurs when an electric field is applied is a relation known as the Kramers-Kronig relation.

The principle of operation of the integrated optoelectronic device 1 will now be described with reference to FIGS. 1A-3. The light beam in VCSEL 2 is nearly perpendicular to the highly-reflective layer 6; it diverges by only a small angle, $\alpha$, relative to the normal to layer 6. As indicated above, this angle is between 0° and about 20° and is typically less than or equal to about 12°. The arrows 21 in FIG. 1B represents the reflections of the light by the top and bottom DBRs 3 and 4 as the DBRs 3 and 4 perform the pumping action that ultimately leads to lasing. The arrows 22 represent the light that is ultimately reflected at the angle $\alpha$ into the single optical coupling 9c of the VCSEL-to-MZM coupling 9 and then continues on in a zig-zag path through the device 1. When fabricating the VCSEL 2, an opening, or gap, is created in the normally continuous optical confinement region of the VCSEL 2 that allows the light represented by arrow 22 to be tapped laterally to feed the optical coupling 9c of the input Y-junction 9.

The tapped light from the VCSEL 2 retains the essential "vertical emitting" characteristics of the VCSEL optical mode, and therefore propagates laterally through the device 1 in a relatively long zig-zag path. The lateral propagation of the light in the long zig-zag path results in the light exhibiting slow effective lateral group velocity. This "slow light" allows a long optical path length to be realized within a short physical length of the device 1. The short physical length of the device 1 translates into small capacitance, which translates into a large modulation bandwidth for the device 1.

The QW region of the MZM 10 has an optical absorption threshold wavelength that is shifted by applying an electric field across the arms 10a and 10b. As indicated above, this shifting of the optical absorption threshold wavelength caused by the application of the electric field is the QCSE phenomenon. With reference again to FIG. 2, curve 27 is a shifted version of curve 25, which indicates the occurrence of QCSE. The shift in the curve 25 shown in FIG. 2 corresponds to a shift in the optical absorption threshold wavelength in the QW region, which occurs in the QW region of the MZM 10 when the electric field is applied to the electrodes 11a-11c.

With reference again to FIG. 3, curve 33 is a shifted version of curve 31. The photon energy at which the device operates in the same for curves 31 and 33, but the refractive indexes at the point of operation of the device are different for the curves 31 and 33. This demonstrates the refractive index change, Δn, that occurs in the MZM 10 when the electric field is applied in accordance with the Kramer-Kronig relation.

The refractive index change results in a phase change for light traveling in one or both of the arms 10a and 10b of the MZM 10, depending on whether the bias voltage is applied across one or both of the arms 10a and 10b. The phase change results in a phase change difference between the two arms 10a and 10b of the MZM 10. The phase change difference produces interferences and intensity modulation in the output optical coupling 12c of the Y-junction 12 where the light from the two arms 10a and 10b meets. The phase change difference between the two arms 10a and 10b that accumulates due to the change in refractive index caused by the application of an electric field may be achieved in a number of ways. For example, this can be achieved through various arrangements of the electrodes 11a-11c and/or through various biasing schemes for the electrodes 11a-11c and/or through differences between the lengths of the arms 10a and 10b, as will be described below with reference to FIGS. 4 and 5.

Figure 4:
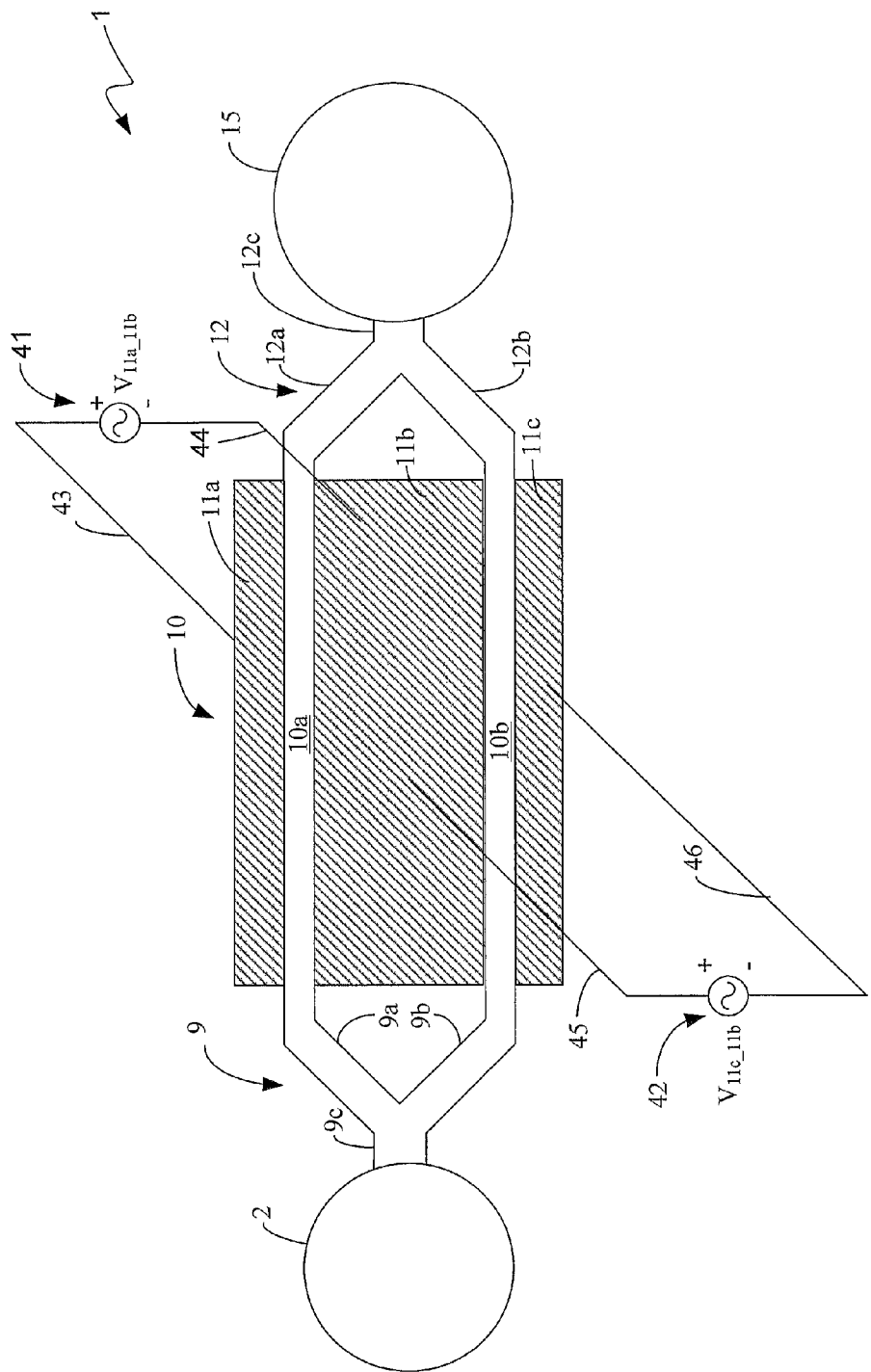
FIG. 4 illustrates a top view of the integrated optoelectronic device shown in FIG. 1 with the electrodes of the MZM attached to first and second AC power sources for performing push-pull biasing.

FIG. 4 illustrates a top view of the integrated optoelectronic device 1 shown in FIG. 1 with the electrodes 11a-11c of the MZM 10 attached to first and second alternating current (AC) power sources 41 and 42. The AC power source 41 is connected by first and second conductors 43 and 44 to electrodes 11a and 11b, respectively. The AC power source 42 is connected by first and second conductors 45 and 46 to electrodes 11b and 11c, respectively. The power source 41 applies an AC bias voltage to electrodes 11a and 11b that creates a voltage differential across arm 10a having a first polarity. The power source 42 applies an AC bias voltage to electrodes 11b and 11c that creates a voltage differential across arm 10b having a second polarity that is 180° out of phase from the first polarity. This configuration of the power sources 41 and 42 and the electrodes 11a-11c will be referred to hereinafter as a push-pull biasing configuration. In accordance with this illustrative embodiment, the arms 10a and 10b are of the same length. When the arms 10a and 10b are of the same length, the MZM 10 will be referred to hereinafter as being symmetric.

The push-pull biasing configuration maximizes the difference in phase shifts between arms 10a and 10b and thereby enables the desired amount of light modulation to be realized in the MZM 10 with the arms 10a and 10b having lengths that are shorter than they would otherwise be if only one of the two arms 10a and 10b is driven by the electrical modulation signal being applied to the electrodes 11a, 11b and/or 11c. The long optical zig-zag path of the light indicated by the arrow labeled 22 in FIG. 1B also enhances optical absorption in the MZM 10, which ultimately translates into a larger phase change for the light propagating in the arms 10a and 10b. The combination of all of these factors ensures that there is a large amount of interference and modulation of the light as it enters the output optical coupler 12c of the Y-junction 12.

With reference again to FIGS. 1A and 1B, because the modulated light passing out of the output Y-junction 12 and into the output cavity 15 is propagating along the zig-zag path at very small angles relative to the normal to the top surface 17 of the output cavity 15, the light couples efficiently into the vertical emitting modes of the output cavity 15. The output cavity 15 may be unbiased, in which case the output cavity 15 passively passes the light into vertical emission (i.e., emission in the direction of arrow 16 in FIG. 1B). Alternatively, the output cavity 15 can have a positive bias, in which case the output cavity 15 acts as an optical amplifier that amplifies the light before the light is emitted from the output cavity 15 through the top surface 17 of the output cavity 15 in the direction of arrow 16.

Figure 5:
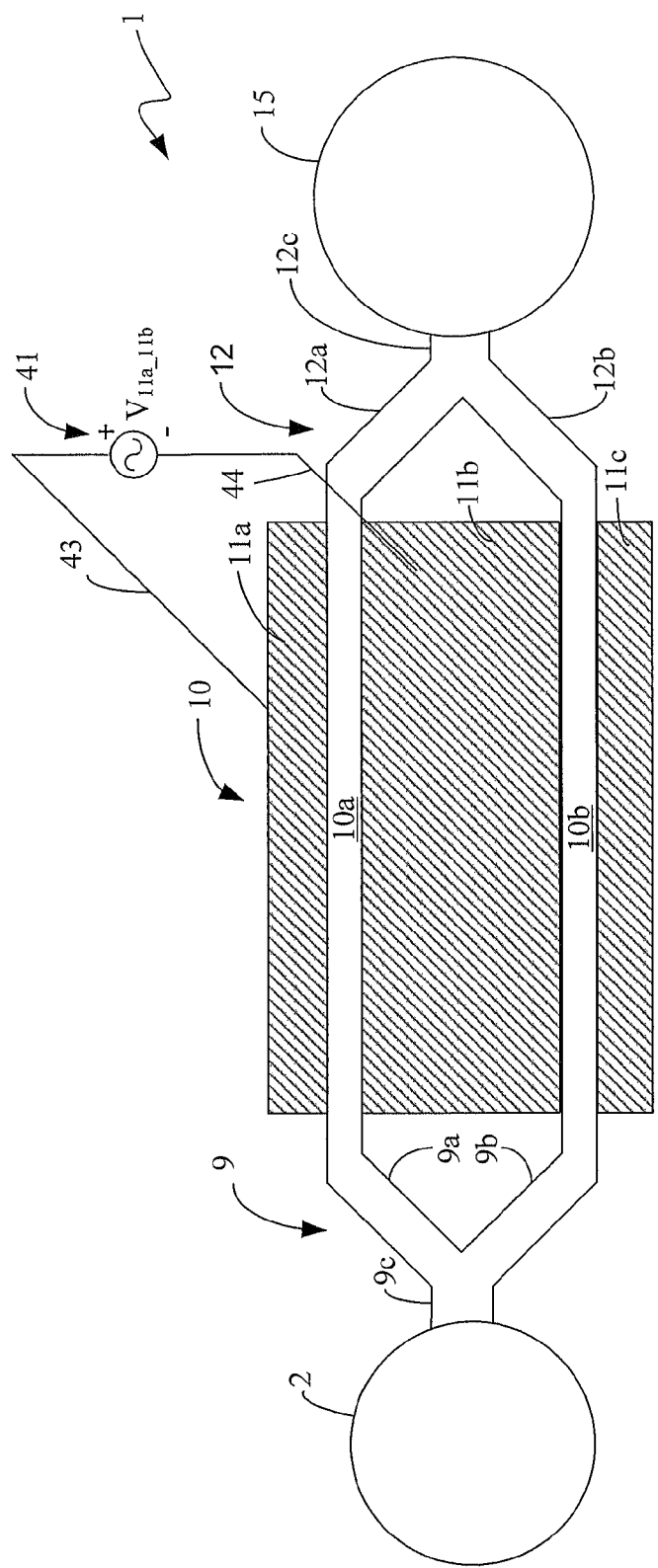
FIG. 5 illustrates a top view of the integrated optoelectronic device shown in FIG. 1 with the electrodes of the MZM shown in FIGS. 1A and 1B attached to the first AC power source shown in FIG. 4 for asymmetrically biasing one of the arms of the MZM.

FIG. 5 illustrates a top view of the integrated optoelectronic device 1 shown in FIG. 1 with the electrodes 11a and 11b of the MZM 10 attached to the first AC power source 41 by conductors 43 and 44 for biasing arm 10a. In accordance with this illustrative embodiment, the arms 10a and 10b are of different lengths, and therefore the MZM 10 has an asymmetric configuration. Having arms 10a and 10b of unequal length creates a pre-bias of the phase difference produced by the two arms 10a and 10b. This pre-bias can be used to compensate for certain process offsets, or to produce an additional phase difference in the event that the application of the electric field does not produce the full 180° phase difference desired or needed. The disadvantage of such an arm length difference is that it produces stronger wavelength dependence. For this reason, when using the push-pull biasing configuration of FIG. 4, efforts are typically made to avoid even small arm length differences.

The power source 41 applies an AC bias voltage to electrodes 11a and 11b that creates a voltage differential across arm 10a. This asymmetric biasing configuration enhances the optical absorption change in the MZM 10 through QCSE, which is manifested as a refractive index change in the MZM 10 in accordance with the Kramer-Konig relation. As indicated above, the refractive index change accumulates as a large phase change in the light traveling in the arm 10a. This phase change in combination with the phase change caused by the difference in the arm lengths results in the light being, ideally, 180° out of phase when it passes out of the arms 10a and 10b into the output Y-junction 12. This large phase difference ensures that there is a large amount of interference and intensity modulation in the light as it enters the output optical coupling 12c of the output Y-junction 12.

The modulated light passes out of the output Y-junction 12 and into the output cavity 15. Again, because the modulated light entering the output cavity 15 is propagating along the zig-zag path at very small angles relative to the normal to the top surface 17 of the output cavity 15, the light couples efficiently into the vertical emitting modes of the output cavity 15. As indicated above with reference to FIG. 4, the output cavity 15 may be unbiased or positively biased to either passively pass the light or to amplify the light, respectively.

Figure 6:
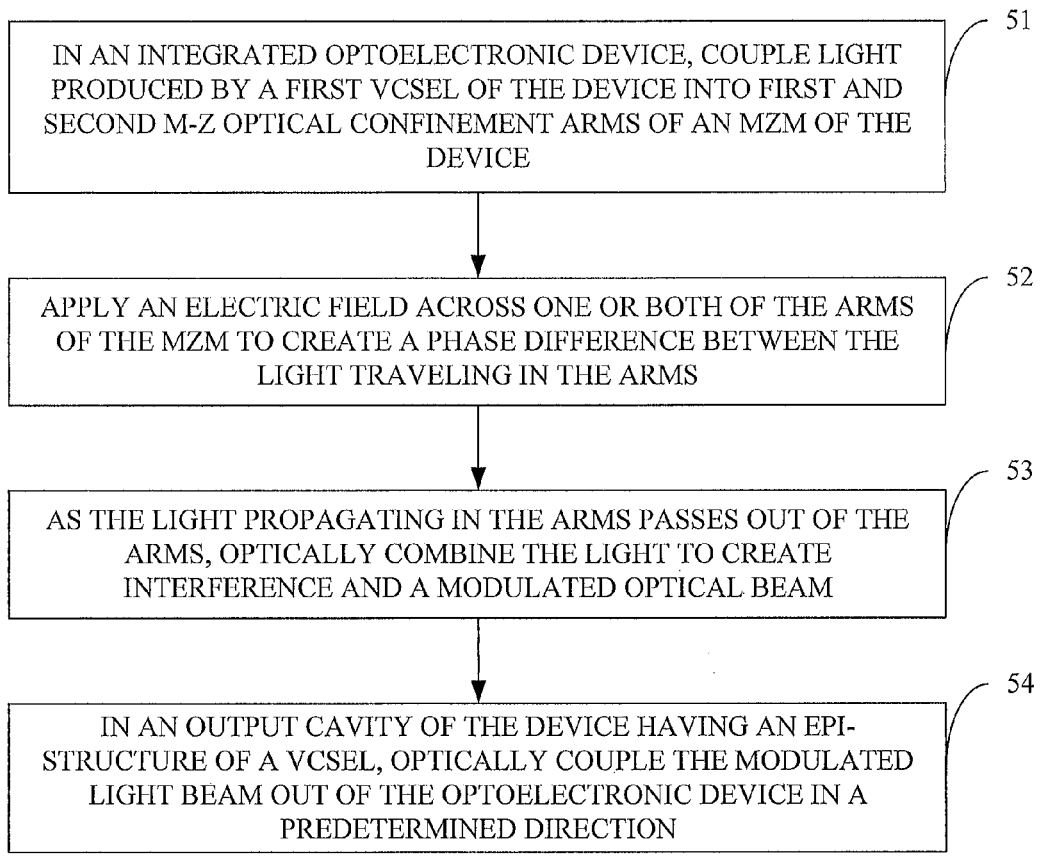
FIG. 6 illustrates a flow diagram that represents the method in accordance with an embodiment.

FIG. 6 illustrates a flow diagram that represents the method in accordance with an embodiment, which will now be described. In an integrated optoelectronic device, light produced by a first VCSEL is optically coupled into first ends of first and second Mach-Zehnder optical confinement arms of the MZM, as indicated by block 51. An electric field is applied across one or both of arms to create a phase difference between the light traveling in the arms, as indicated by block 52. The light propagating in the first and second arms is then optically combined as it passes out of second ends of the first and second arms to create a modulated light beam, as indicated by block 53. An output cavity of the optoelectronic device having an epi-structure of a VCSEL then optically couples the modulated light beam out of the integrated optoelectronic device in a predetermined direction, as indicated by block 54.

It should be noted that the invention has been described with reference to a few illustrative embodiments for the purposes of demonstrating the principles and concepts of the invention. The invention, however, is not limited to these embodiments, as will be understood by persons of skill in the art in view of the disclosure provided herein. Many modifications can be made to the embodiments described herein, and all such modifications are within the scope of the invention.

What is claimed is:

1. An optoelectronic device comprising:
   a substrate;
   a first vertical cavity surface emitting laser (VCSEL) disposed on the substrate having a first distributed Bragg reflector (DBR) disposed above the substrate, a first quantum well (QW) region disposed above the first DBR, a second DBR disposed above the first QW region, and a first reflector disposed above the second DBR opposite the substrate, the first reflector reflecting light produced by the first VCSEL back into the optoelectronic device; and
   a Mach-Zehnder modulator (MZM) horizontally integrated into the optoelectronic device beside the first VCSEL, wherein the MZM receives light produced by the first VCSEL and modulates the received light to produce a modulated optical signal, wherein the MZM has a second reflector disposed in or on the MZM that prevents the light received from the first VCSEL from passing through a top surface of the MZM, wherein the first and second reflectors are different portions of a single reflector.

2. The optoelectronic device of claim 1, further comprising:
   an output cavity having a structure of a VCSEL, the output cavity being horizontally integrated into the optoelectronic device beside the MZM opposite the first VCSEL, the output cavity comprising a third DBR, a second QW region disposed above the third DBR, and a fourth DBR disposed above the second QW region, the output cavity receiving the modulated optical signal passing out of the MZM and directing the modulated optical signal out of the optoelectronic device in a direction parallel to an optical axis of the output cavity.

3. The optoelectronic device of claim 2, wherein the MZM includes at least an input optical Y-junction, first and second optical confinement arms, and an output optical Y-junction, the input optical Y-junction having a first branch that joins the first VCSEL for receiving light produced by the first VCSEL, the input optical Y-junction having second and third branches that join first ends of the first and second optical confinement arms, respectively, the output optical Y-junction having fourth and fifth branches that join second ends of the first and second optical confinement branches, respectively, for receiving light propagating out of the second ends of the first and second arms and combining the received light to produce the modulated optical signal, and wherein the output optical Y-junction has a sixth branch having an end that joins the output cavity for coupling the modulated optical signal into the output cavity.

4. The optoelectronic device of claim 3, wherein the MZM includes at least first and second electrodes for applying an electric field to the MZM to create a voltage differential across one or both of the first and second optical confinement arms.

5. The optoelectronic device of claim 4, wherein the application of the electric field to the MZM creates a voltage differential across the first optical confinement arm, and wherein the voltage differential across the first optical confinement arm causes a phase change to occur in light propagating in the first arm such that a phase difference exists between the light propagating in the first and second arms, and wherein the phase difference results in interference and modulation of the light when the light propagates into the output optical Y-junction.

6. The optoelectronic device of claim 5, wherein the first and second arms have equal lengths.

7. The optoelectronic device of claim 5, wherein the first and second arms have unequal lengths.

8. The optoelectronic device of claim 3, wherein the MZM includes at least first, second and third electrodes for applying a first voltage differential to the first and second electrodes and a second voltage differential to the second and third electrodes, wherein the first voltage differential is across the first optical confinement arm and the second voltage differential is across the second optical confinement arm.

9. The optoelectronic device of claim 8, wherein the first and second voltage differentials are alternating current (AC) voltage differentials that are 180° out of phase.

10. The optoelectronic device of claim 9, wherein the application the first and second voltage differentials across the first and second optical confinement arms, respectively, causes first and second phase changes to occur in light propagating in the first and second arms, respectively, such that a phase difference exists between the light propagating in the first and second arms, and wherein the phase difference results in interference and modulation of the light when the light propagates into the output optical Y-junction, and wherein the interference and modulation of the light produces the modulated optical signal.

11. The optoelectronic device of claim 2, wherein the first reflector reflects light produced by the first VCSEL at a small, non-zero-degree angle relative to a normal to the lower surface of the first reflector, the angle ranging from between zero degrees and about twenty degrees, and wherein the light reflected at the angle propagates through the MZM being reflected by upper and lower DBRs of the MZM at the small angle, and wherein the second reflector prevents any light that passes through the upper DBR of the MZM from passing out of the MZM through the top surface of the MZM.

12. The optoelectronic device of claim 11, wherein the output cavity is a second VCSEL that amplifies the modulated optical signal prior to directing the modulated optical signal out of the optoelectronic device.

13. The optoelectronic device of claim 11, wherein the output cavity directs the modulated optical signal out of the optoelectronic device without amplifying the modulated optical signal.

14. The optoelectronic device of claim 11, wherein the first VCSEL, the output cavity and the MZM share a same epitaxial structure.

15. An optoelectronic device comprising:
   a substrate;
   a first vertical cavity surface emitting laser (VCSEL) disposed on the substrate, the first VCSEL having a first distributed Bragg reflector (DBR) disposed above the substrate, a first quantum well (QW) region disposed above the first DBR, a second DBR disposed above the first QW region, and a first reflector disposed above the second DBR opposite the substrate, the first reflector reflecting light produced by the first VCSEL back into the optoelectronic device;
   a Mach-Zehnder modulator (MZM) horizontally integrated into the optoelectronic device beside the first VCSEL, wherein the MZM receives light produced by the first VCSEL and modulates the received light to produce a modulated optical signal, wherein the MZM has a second reflector disposed in or on the MZM that prevents the light received from the first VCSEL from passing through a top surface of the MZM; and an output cavity horizontally integrated into the optoelectronic device beside the MZM opposite the first VCSEL, the output cavity receiving the modulated optical signal passing out of the MZM and directing the modulated optical signal out of the optoelectronic device in a direction parallel to an optical axis of the output cavity.

16. The optoelectronic device of claim 15, wherein the first and second reflectors are separate reflectors.

17. The optoelectronic device of claim 15, wherein the first and second reflectors are different portions of a single reflector.

18. The optoelectronic device of claim 15, wherein the output cavity has a structure of a VCSEL and comprises a third DBR disposed above the substrate, a second QW region disposed above the third DBR, and a fourth DBR disposed above the second QW region.

19. The optoelectronic device of claim 15, wherein the first reflector reflects light produced by the first VCSEL at a small non-zero-degree angle relative to a normal to the lower surface of the first reflector, the angle ranging from between zero degrees and about twenty degrees, and wherein the light reflected at the angle propagates through the MZM being reflected by upper and lower DBRs of the MZM at the small angle.

20. The optoelectronic device of claim 19, wherein the MZM includes at least an input optical Y-junction, first and second optical confinement arms, and an output optical Y-junction, the input optical Y-junction having a first branch that joins the first VCSEL for receiving light produced by the first VCSEL, the input optical Y-junction having second and third branches that join first ends of the first and second optical confinement arms, respectively, the output optical Y-junction having fourth and fifth branches that join second ends of the first and second optical confinement branches, respectively, for receiving light propagating out of the second ends of the first and second arms and combining the received light to produce the modulated optical signal, and wherein the output optical Y-junction has a sixth branch having an end that joins the output cavity for coupling the modulated optical signal into the output cavity.

21. The optoelectronic device of claim 20, wherein the MZM includes at least first and second electrodes for applying an electric field to the MZM to create a voltage differential across one or both of the first and second optical confinement arms.

22. The optoelectronic device of claim 21, wherein the application of the electric field to the MZM creates a voltage differential across the first optical confinement arm, and wherein the voltage differential across the first optical confinement arm causes a phase change to occur in light propagating in the first arm such that a phase difference exists between the light propagating in the first and second arms, and wherein the phase difference results in interference and modulation of the light when the light propagates into the output optical Y-junction.

23. The optoelectronic device of claim 22, wherein the first and second arms have equal lengths.

24. The optoelectronic device of claim 22, wherein the first and second arms have unequal lengths.

25. The optoelectronic device of claim 20, wherein the MZM includes at least first, second and third electrodes for applying a first voltage differential to the first and second electrodes and a second voltage differential to the second and third electrodes, wherein the first voltage differential is across the first optical confinement arm and the second voltage differential is across the second optical confinement arm.

26. The optoelectronic device of claim 25, wherein the first and second voltage differentials are alternating current (AC) voltage differentials that are 180° out of phase.

27. The optoelectronic device of claim 26, wherein the application of the first and second voltage differentials across the first and second optical confinement arms, respectively, causes first and second phase changes to occur in light propagating in the first and second arms, respectively, such that a phase difference exists between the light propagating in the first and second arms, and wherein the phase difference results in interference and modulation of the light when the light propagates into the output optical Y-junction, and wherein the interference and modulation of the light produces the modulated optical signal.

28. An optoelectronic device comprising:
a substrate;
a first vertical cavity surface emitting laser (VCSEL) disposed on the substrate, the first VCSEL having a first distributed Bragg reflector (DBR) disposed above the substrate, a first quantum well (QW) region disposed above the first DBR, a second DBR disposed above the first QW region, and a first reflector disposed above the second DBR opposite the substrate, the first reflector reflecting light produced by the first VCSEL back into the optoelectronic device, wherein the first reflector reflects light produced by the first VCSEL at a small non-zero-degree angle relative to a normal to the lower surface of the first reflector, the angle ranging from zero degrees to about twenty degrees;
a Mach-Zehnder modulator (MZM) horizontally integrated into the optoelectronic device beside the first VCSEL, wherein the MZM receives light produced by the first VCSEL, and wherein the light reflected at the small non-zero-degree angle propagates through the MZM being reflected by upper and lower DBRs of the MZM at the small angle, wherein the MZM modulates the received light to produce a modulated optical signal, wherein the MZM has a second reflector disposed in or on the MZM that prevents the light received from the first VCSEL from passing through a top surface of the MZM; and
an output cavity horizontally integrated into the optoelectronic device beside the MZM opposite the first VCSEL, the output cavity receiving the modulated optical signal passing out of the MZM and directing the modulated optical signal out of the optoelectronic device in a direction parallel to an optical axis of the output cavity.

* * * * *